United States Patent [19]

Schulz et al.

[11] Patent Number: 5,053,717

[45] Date of Patent: Oct. 1, 1991

[54] FSK DEMODULATOR

[75] Inventors: Gary D. Schulz, Mount Prospect; Dennis E. Burke, Elmhurst, both of Ill.

[73] Assignee: Motorola, Inc., Schaumburg, Ill.

[21] Appl. No.: 434,746

[22] Filed: Nov. 13, 1989

Related U.S. Application Data

[63] Continuation-in-part of Ser. No. 417,375, Oct. 5, 1989, Pat. No. 4,987,374.

[51] Int. Cl.$^5$ .................... H03D 3/00; H03D 3/06
[52] U.S. Cl. .................... 329/300; 329/336; 329/337; 375/76; 375/80; 375/88
[58] Field of Search ............. 329/300, 301, 302, 303, 329/336, 337; 375/76, 80, 88

[56] References Cited

U.S. PATENT DOCUMENTS 4,451,792 5/1984 Gay .................... 329/336 X

Primary Examiner—David Mis
Attorney, Agent, or Firm—Charles L. Warren

[57] ABSTRACT

An improved multilevel FSK demodulator, according to the invention, is provided that down-converts the IF frequency back to baseband quadrature via dual mixers. The improved multilevel FSK demodulator uses controllable time-delay in the demodulation process. This method requires a 90° phase difference between 2 modulated signals to produce a maximum demodulated output amplitude at the maximum frequency deviation. Since the IF frequencies have been down-converted back to baseband quadrature, these 2 signals are only "out of phase" by an amount $\Delta t$ that is equal to $90°/d\omega$. A further aspect of this invention addresses minimizing the DC offset from the demodulator by providing a feedback signal which controls the amount of delay provided to one of the quadrature signals.

10 Claims, 2 Drawing Sheets

FSK DEMODULATOR

This is a continuation-in-part of application Ser. No. 07/417,375, filed 10/5/89, now U.S. Pat. No. 4,987,374.

TECHNICAL FIELD

This invention pertains to FM demodulators and more particularly to FSK demodulators using time-delay demodulation. This invention addresses minimizing undesired DC offsets at the demodulator which degrades signal detection.

BACKGROUND OF THE INVENTION

It is known that traditional quadrature FM detectors are used in FM receiver IF stages to demodulate two-tone and multilevel FSK signalling. This method is successful because a quadrature FM demodulator detects the difference between an input IF signal frequency and a fixed center frequency tuned by a bandpass filter.

It is also known that a frequency and phase-locked loop (FPLL) may be used to detect the difference between two signals--the input signal and the output of a VCO. This new type of frequency difference detector is a quadrature FM detector that has had a "bandpass-to-lowpass" transformation performed on it.

The idea of configuring an FM demodulator in a "zero IF" form is to utilize the "bandpass-to-lowpass" transformation to the advantage that "drift" of the bandpass center tuning filter can be eliminated. As a result, the discriminator's characteristic "S" curve is now solely dependent on the phase characteristic of the low pass filter, which is now designed at "baseband" frequencies. Proper design of this LPF can produce the required "S" curve. Essentially, the whole FSK demodulator (two-tone or multilevel) could be designed as a fast-acquisition FPLL, but it might be easier to use just the frequency difference detector to create a zero-IF signal, ready for demodulation by baseband components operating in an open-loop mode.

As a result, it has been proposed that the VCO be replaced with a crystal-controlled oscillator. This double-mixer concept will produce 2 signals that are in phase quadrature, but converted down to baseband.

One advantage of using baseband signals that are time-delayed to demodulate an FSK signal is that the time-delay element, to wit, the LPF, may be replaced with a digital equivalent. This digital equivalent may be implemented as a tapped delay line with selectable taps. If this is done directly at the IF frequency (traditional IFs could be in the low VHF band), the period of the IF waveform would be only a few nanoseconds. For example, the period of a 70 MHz IF signal is only 14.2857 nanoseconds. The time-delay FSK demodulation method requires a 90° phase difference between 2 modulated signal paths to produce a maximum demodulated output amplitude at the maximum frequency deviation. Hence, these 2 signals are only "out of phase" by 3.5714 nanoseconds. As a result, it is difficult to achieve multiple tap positions over only 3.57 nanoseconds total delay. Obviously, it would be desirable to provide an improved multilevel FSK demodulator.

Traditional quadrature FM discriminators utilize a phase shift network that is tuned to the center of the IF carrier. This phase shift network typically consists of a resonant circuit, such as a parallel coil and capacitor. To obtain equal amplitude excursions of the demodulated signals the network must be tuned to the exact frequency of the IF carrier. A DC offset will result if the network becomes tuned other than to the center of the incoming signal. Thus, component tolerances for the network are very critical.

SUMMARY OF THE INVENTION

It is an object of the invention to provide an improved multilevel FSK demodulator. Accordingly, an improved multilevel FSK demodulator, according to the invention, is provided that down-converts the IF frequency back to baseband quadrature via dual mixers. The improved multilevel FSK demodulator uses time-delay in the demodulation process. This method utilizes a steady state 90° phase difference between 2 modulated signals. A maximum demodulated output amplitude occurs at maximum frequency deviations. Since the IF frequencies have been down-converted back to baseband quadrature, these 2 signals are only "out of phase" by an amount $\Delta t$ that is equal to $90°/d\omega$. For a $d\omega$ of 4 MHz, this gives a $\Delta t = 62.5$ nanoseconds. As a result, it is easier to achieve a delay that is adjustable about 90 degrees using a delay line with multiple tap positions to produce 62.5 nanoseconds total delay.

It is a further object of this invention to minimize undesired DC offsets at the demodulator. In accordance with an embodiment of the present invention, the output of the demodulator is compared to a zero voltage reference to produce an error signal. This error signal is converted from analog to digital form and is utilized to control the delay of a selectable delay line to provide a 90° phase offset needed for quadrature demodulation.

DETAILED DESCRIPTION OF THE INVENTION

Figure 1:
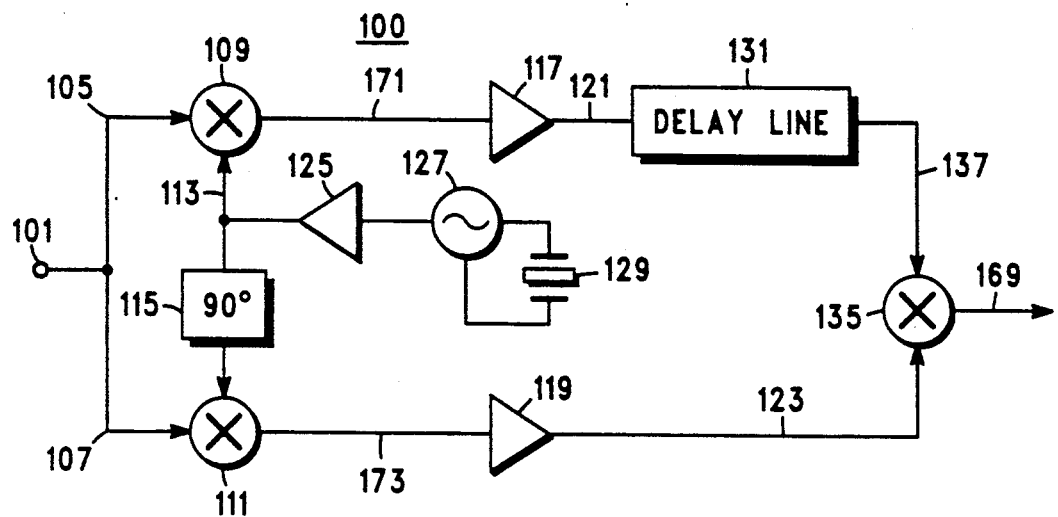
FIG. 1 is a block diagram showing a first embodiment of an FSK demodulator, according to the invention.

Referring to FIG. 1, there is shown a first embodiment 100 of the invention. It is assumed the IF frequency is 70 MHz and the frequency deviation $\Delta\omega = \pm 4$ MHz. As shown, the input IF signal 101 is split into two paths 105 and 107 and input to a first product detector (or multiplier) 109 and a second product detector (or multiplier) 111.

Also shown is an oscillator 127 operating at the IF frequency and controlled by a crystal 129. The oscillator output is isolated by buffer amplifier 125 and then split into two paths. The first path 113 is directly input to the first multiplier 109, while the second path 115 is shifted by 90° and input to the second multiplier 111. It will be appreciated that the first path 113 is equivalent to either shifting the signal by 0° or else by 360°.

The output 171 from the first multiplier 109 is then limited by limiter 117 and the result 121 is input to the delay line 131. The delay line 131 is arranged with multiple taps which act to adjust the overall delay ($\Delta t$). The output 137 is then input to a third multiplier or product detector 135.

The output 173 from the second multiplier 111 is next limited by limiter 119 and the result 123 input to the third multiplier 135. With this arrangement, the output 169 of the third multiplier 135 comprises the FSK output.

If the maximum deviation $\Delta\omega$ is $\pm 4$ MHz for a 70 Mhz IF, then a suitable initial delay is $(\frac{1}{4})*(1/70$ MHz$)=62.5$ nanoseconds. As a result, it is easy to get tapped delay lines (such as element 131) with 5 nanosecond delay tap increments.

Figure 2:
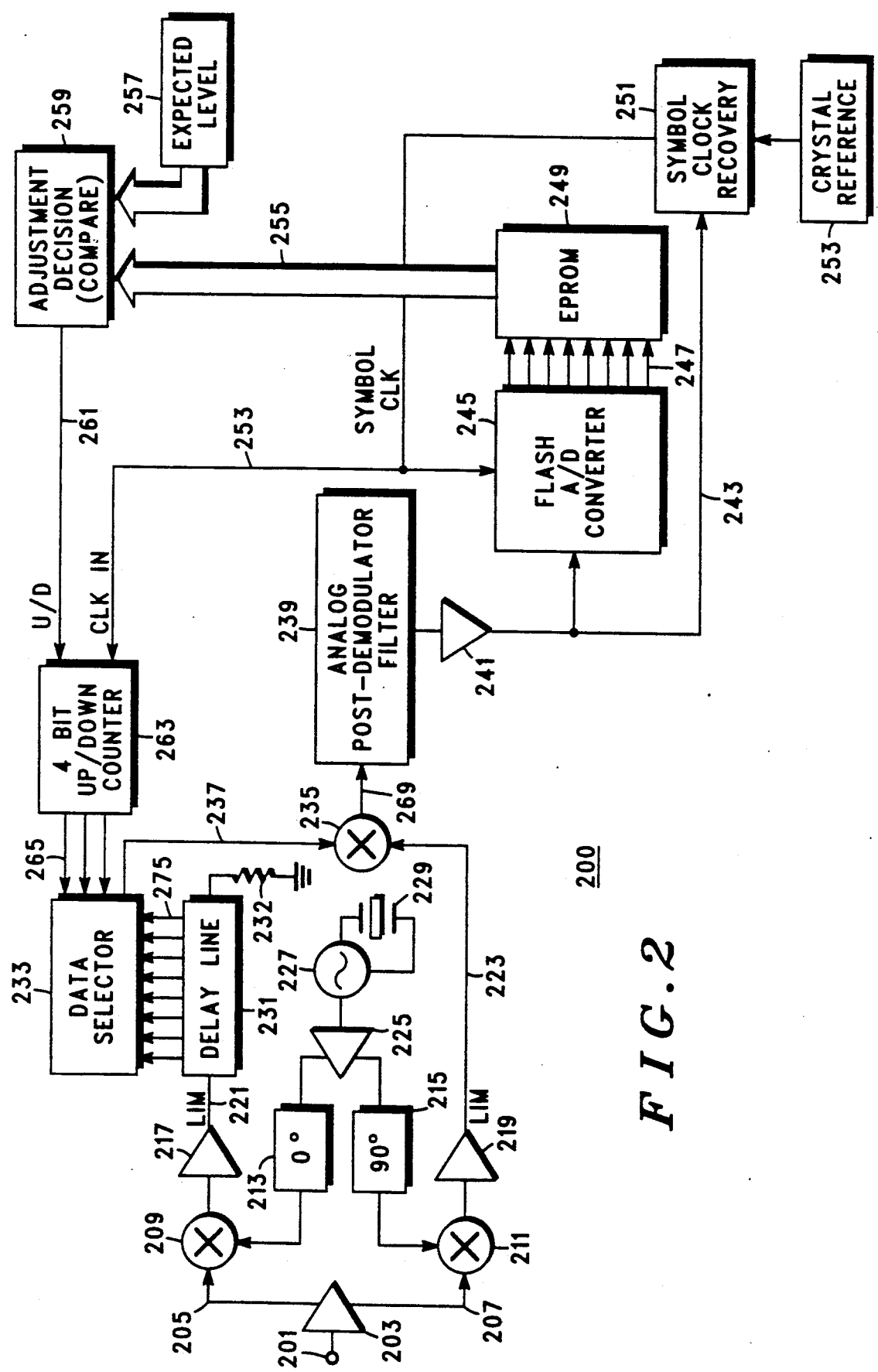
FIG. 2 is a more detailed block diagram of the embodiment of FIG. 1.

Referring to FIG. 2, there is shown embodiment 200 of the present invention. It is assumed the IF frequency is 70 MHz and the frequency deviation $\Delta\omega=\pm 4$ MHz. As shown, the input IF signal 201 is split into two paths 205 and 207 and input to a first product detector or multiplier 209 and a second product detector 211.

Also shown is an oscillator 227 operating at the IF frequency and controlled by a crystal 229. The oscillator output is isolated by buffer amplifier 225 and then split into two paths. The first path 213 is shifted by 0° or else by 360° and then input to the first multiplier 209, while the second path 215 is shifted by 90° and input to the second multiplier 211.

The output from the first multiplier 209 is then limited by limiter 217 and the result 221 is input to the delay line 231 which is terminated by resistor 232. The delay line 231 is arranged with multiple taps 275, which can be selected by data selector 233 to adjust the overall delay ($\Delta t$). The delayed output 237 is then input to a third multiplier or product detector 235.

The output from the second multiplier 211 is next limited by limiter 219 and the result 223 is input to the third multiplier 235. With this arrangement, the output 269 of the third multiplier 235 comprises the FSK output.

The output 269 of the third multiplier must be filtered by 239 to remove high frequency mixing products, and to "shape" the received signal pattern such that intersymbol interference due to communication channel non-linearities is reduced.

Amplifier 241 is used to bring the demodulated symbol information to the correct analog level such that it may be digitized by the fast (flash) video A/D converter 245. The symbol signal path 243 feeds into a clock recovery network 251, whose purpose is to line up the phase of the crystal reference 253 with that special portion of the symbolized information "packet". Network 251 must sample a special "header" symbol sequence to determine the phase of the incoming demodulated symbols. The synchronization process guarantees that the fast (flash) video A/D converter 245 samples the symbol at the correct time slot.

The outputs 247 of the fast (flash) video A/D converter 245 (typically, MC10321) are the n-bit digitized value of the demodulated FSK symbol, with each level of the multilevel signalling characterized by a distinct symbol. Stored in EPROM 249 are the digital bit stream equivalents corresponding to the 2 to the nth addresses. The parallel bit stream 255 is fed to a decision circuit 259 that takes this incoming data and compares the bits with a special bit pattern stored in block 257. This stored pattern, known as a "preamble", equates to only those bit sequences that identify the n-level symbols.

The output of decision circuit 259 is a logic level on line 261 indicating to 4-bit UP counter 263 (typically 74F169) that it should count UP or DOWN at the symbol rate, fed into 263 at its clock input via line 253. As shown in FIG. 2, a data selector 233 (8 bit in this case, typical 74F251)) takes the count from 263 by lines 265, and selects one tap, via lines 275, of adjustable delay line 231. This adjustment process takes place for as long as the preamble signal pattern is sent to the demodulator circuit. To those skilled in the art, it will be realized that the final value selected for the tap on the delay line will remain the same during the remainder of the typically short burst transmissions.

It will be appreciated by those skilled in the art that this embodiment permits digital selection of the adjustable tap delay line 231, thereby allowing for the implementation in a feedback scheme so that the demodulation sensitivity can be automatically corrected for those systems relying on accurate demodulated information amplitude, to wit, multilevel FSK signalling. This embodiment would also allow for parameter variations, since the chosen delay value may change over environmental changes, so that a new value tap would be selected to compensate for these variations. The "fine-tuning" is based on the number of taps used and the incremental time delay provided by each tap position.

Another advantage of the digitally-selectable tap, over the low pass filter time delay, is that the delay through the analog low pass filter is not constant as a function of frequency. In other words, $\Delta\theta/\Delta\omega \neq$ (fixed)$\tau_d$ unless the filter were special and costly. With the tap delay line, the chosen $\Delta\theta/\Delta\omega$ is constant over the deviation band (baseband bandwidth).

Figure 3:
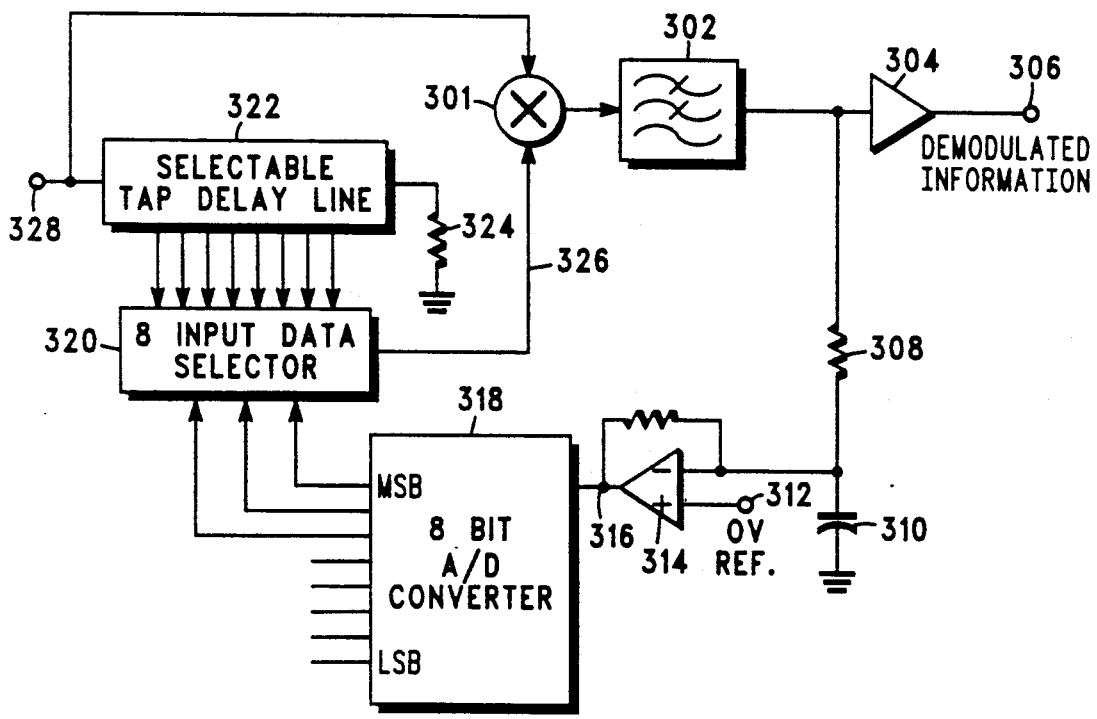
FIG. 3 is a block diagram showing another embodiment of an improved FSK demodulator according to the present invention which minimizes DC offset error.

FIG. 3 illustrates an embodiment of a quadrature demodulator which includes feedback that is utilized to minimize DC offset voltage. The output of multiplier or mixer 301 is lowpass filtered by filter 302 and amplified by amplifier 304. Its output 306 consists of the demodulated information.

The output of filter 302 is further filtered by a lowpass filter consisting of resistor 308 and capacitor 310. This resulting signal is compared to a zero DC voltage reference 312 and amplified by amplifier 314 to produce a resulting analog signal 316 proportional to the DC offset error.

This error signal is converted into a digital form by analog to digital converter 318. The three most significant bits of the output of the 8 bit A/D converter comprise the three control signals utilized to control the 8 input data selector 320. The inputs of selector 320 are coupled to taps of the delay line 322 which is terminated by resistor 324. The selector couples one of its inputs to output 326 which is coupled to multiplier 301. Thus the amount of delay applied to signal 328 can be controlled relative to the signal with no added delay. The delay is controlled so that signal 326 is 90° out of phase relative to signal 328. The input signal 328 may comprise an IF receiver signal.

The gain of amplifier 314 is adjusted so that the amplitude of signal 316 causes A/D converter 318 to operate in the range of the three most significant bits. Thus, a change in the error signal will cause a resulting change in the three most significant bits output from A/D converter 318. This results in different taps being selected in delay line 322 as controlled by selector 320. A change in the amount of delay alters the phase relationship between signals 328 and 326, and causes a change in the average DC output of multiplier 301. This circuitry constitutes a negative feedback loop which causes the DC offset voltage from multiplier 301 to be minimized.

This embodiment provides an FM discriminator which does not require tuning, thereby providing a significant manufacturing advantage. Variations in DC offset due to component parameter variations and temperature variations are automatically compensated.

The present invention has application for demodulating signals which have been angle modulated, that is, frequency modulated or phase modulated.

While various embodiments of an improved FSK demodulator, according to the invention, are disclosed herein, the scope of the invention is defined by the following claims.

What is claimed is:

1. A demodulator for an angle modulated signal comprising:
    means for splitting said modulated signal into first and second signals;
    means for selectably delaying said first signal to form a signal in quadrature with said second signal;
    means for generating a demodulated output signal from said first and second signals;
    means for generating an error signal representative of the difference between said output signal and a reference signal; and
    means for controlling said delay means in response to said error signal so that said error signal is minimized.

2. The demodulator according to claim 1 wherein said delaying means comprises a delay line with selectable taps.

3. The demodulator according to claim 1 wherein said error generating means comprises a lowpass filter for filtering said demodulated output signal and means for comparing said filtered signal with a reference signal to generate an analog signal.

4. The demodulator according to claim 3 wherein said error generating means further comprises means for converting said analog signal into a digital signal.

5. The demodulator according to claim 4 wherein said delay means is responsive to said digital signal.

6. A demodulator for angle modulated signals comprising:
    means for splitting said modulated signal into first and second signals;
    means for delaying said first signal relative to said second signal to form quadrature related signals;
    means for generating a baseband signal using said first and second signals, said baseband signal including a DC component; and
    feedback means for minimizing said DC component by controlling the delay of said delaying means.

7. The demodulator according to claim 6 wherein said baseband generating means comprises a multiplier for multiplying said first and second signals.

8. The demodulator according to claim 6 wherein said feedback means comprises means for generating an error signal proportional to the difference between said DC component of said baseband signal and a reference signal.

9. The demodulator according to claim 8 wherein said feedback means further comprises means for generating a digital signal corresponding to said error signal and means for controlling said delaying means based upon said digital signal.

10. A method for minimizing DC offset from a demodulator of an angle modulated signal comprising steps of:
    delaying said angle modulated signal to form a first signal;
    generating a baseband signal using said first signal and the angle modulated signal, said baseband signal including a DC component;
    minimizing said DC component by generating a feedback signal proportional to said DC component which controls the delay of said first signal.

* * * * *